(12) United States Patent
Chen et al.

(10) Patent No.: US 9,923,142 B2
(45) Date of Patent: Mar. 20, 2018

(54) METHODS OF GRAPHENE GROWTH AND RELATED STRUCTURES

(71) Applicants: Taiwan Semiconductor Manufacturing Co., Ltd., Hsin-Chu (TW); National Taiwan University, Taipei (TW)

(72) Inventors: Miin-Jang Chen, Taipei (TW); Samuel C. Pan, Hsinchu (TW); Chung-Yen Hsieh, Taipei (TW)

(73) Assignees: Taiwan Semiconductor Manufacturing Co., Ltd., Hsin-Chu (TW); National Taiwan University, Taipei (TW)

( * ) Notice: Subject to any disclaimer, the term of this patent is extended or adjusted under 35 U.S.C. 154(b) by 0 days.

(21) Appl. No.: 15/169,557

(22) Filed: May 31, 2016

(65) Prior Publication Data
US 2017/0346010 A1    Nov. 30, 2017

(51) Int. Cl.
| | |
|---|---|
| *B81C 1/00* | (2006.01) |
| *H01L 51/00* | (2006.01) |
| *H01L 21/02* | (2006.01) |
| *H01L 29/66* | (2006.01) |
| *H01L 29/16* | (2006.01) |

(Continued)

(52) U.S. Cl.
CPC ...... *H01L 51/0013* (2013.01); *H01L 21/0243* (2013.01); *H01L 21/0262* (2013.01); *H01L 21/02527* (2013.01); *H01L 21/02664* (2013.01); *H01L 21/02672* (2013.01); *H01L 29/0657* (2013.01); *H01L 29/1606* (2013.01); *H01L 29/66742* (2013.01); *H01L 51/0048* (2013.01); *H01L 51/0541* (2013.01)

(58) Field of Classification Search
None
See application file for complete search history.

(56) References Cited

U.S. PATENT DOCUMENTS

| | | |
|---|---|---|
| 7,622,734 B2 | 11/2009 | Suwa et al. |
| 2011/0309336 A1 | 12/2011 | Shin et al. |

(Continued)

OTHER PUBLICATIONS

Schwierz, Frank, "Graphene transistors", Nature Nanotechnology, Jul. 2010, pp. 487-496, vol. 5.

(Continued)

*Primary Examiner* — Ali Naraghi
(74) *Attorney, Agent, or Firm* — Haynes and Boone, LLP

(57) ABSTRACT

A method and structure for providing uniform, large-area graphene by way of a transfer-free, direct-growth process. In some embodiments, a SAM is used as a carbon source for direct graphene synthesis on a substrate. For example, a SAM is formed on an insulating surface, and a metal layer is formed over the SAM. The metal layer may serve as a catalytic metal, whereby the SAM is converted to graphene following an annealing process. The SAM is deposited using a VPD process (e.g., an ALD process and/or an MLD process). In some embodiments, a CNT having a controlled diameter may be formed on the surface of a nanorod by appropriately tuning the geometry of the nanorod. Additionally, in some embodiments, a curved graphene transistor may be formed over a curved oxide surface, thereby providing a band gap in a channel region of the graphene transistor.

20 Claims, 10 Drawing Sheets

(51) Int. Cl.
*H01L 51/05* (2006.01)
*H01L 29/06* (2006.01)

(56) References Cited

U.S. PATENT DOCUMENTS

| | | | | |
|---|---|---|---|---|
| 2013/0273326 | A1* | 10/2013 | Denifl | B32B 9/04 428/166 |
| 2014/0120270 | A1* | 5/2014 | Tour | C23C 16/26 427/596 |
| 2014/0145735 | A1* | 5/2014 | Koester | G01N 27/227 324/686 |
| 2015/0093584 | A1* | 4/2015 | Zhang | C08J 3/128 428/447 |
| 2016/0083247 | A1* | 3/2016 | Daneman | B81C 1/00158 438/51 |
| 2016/0233305 | A1* | 8/2016 | Seacrist | H01L 21/283 |
| 2016/0336374 | A1* | 11/2016 | Jiang | H01L 27/156 |

OTHER PUBLICATIONS

Deshpande, Tejas "Graphene Field Effect Transistors", http://technophilicmag.com/2011/02/07/graphene-field-effect-transistors/.

Feng, Lin, "Super-Hydrophobic Surfaces: From Natural to Artificial**"; Advanced Materials, 2002, vol. 14, No. 24, pp. 1857-1860.

Klekachev, Alexander, "Graphene Transistors and Photodetectors", Interface, The Electrochemical Society, Spring 2013, pp. 63-68.

Lafkioti, Myrsini, "Graphene on a Hydrophobic Substrate: Doping Reduction and Hysteresis Suppression under Ambient Conditions", American Chemical Society, Nano Letters, 2010, pp. 1149-1153, vol. 10.

Lee, Wi Hyoung et al., "Control of Graphene Field-Effect Transistors by Interfacial Hydrophobic Self-Assembled Monolayers", Advanced Materials, 2011, pp. 3460-3464, vol. 23.

* cited by examiner

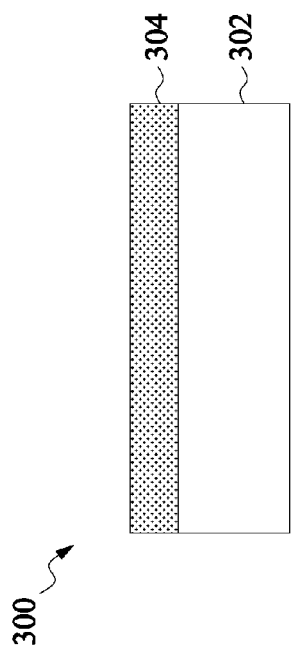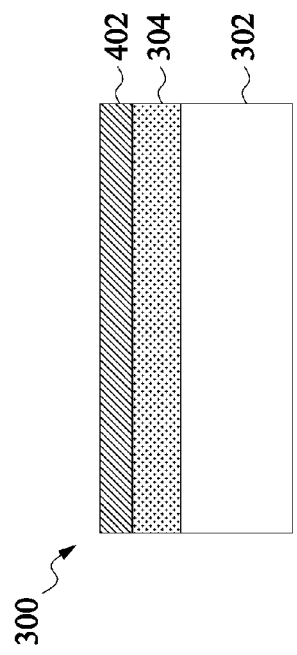

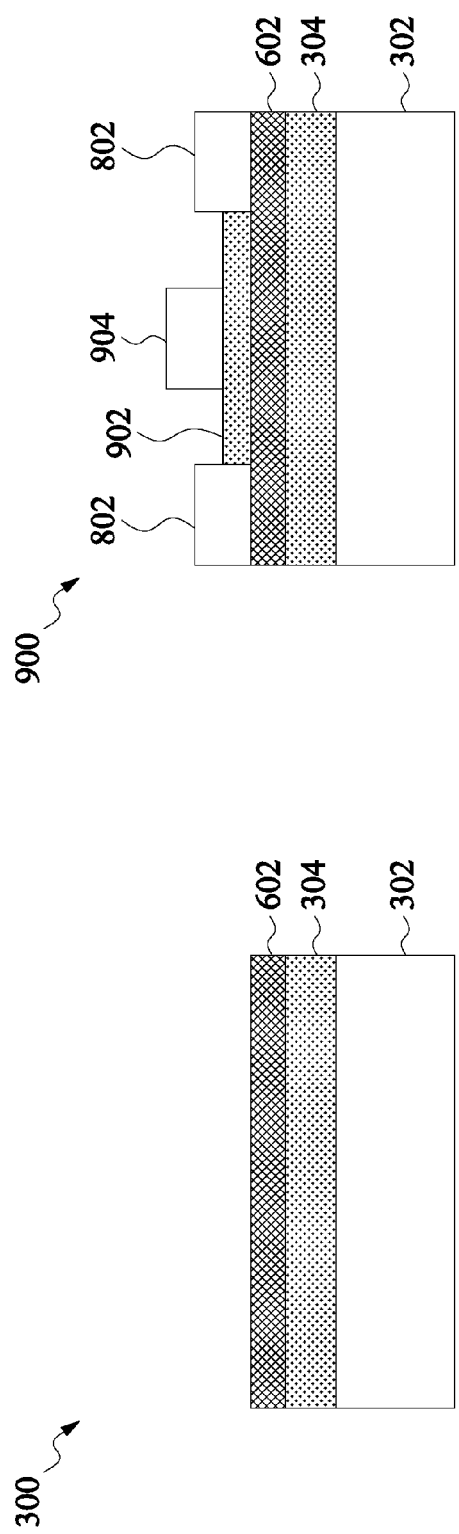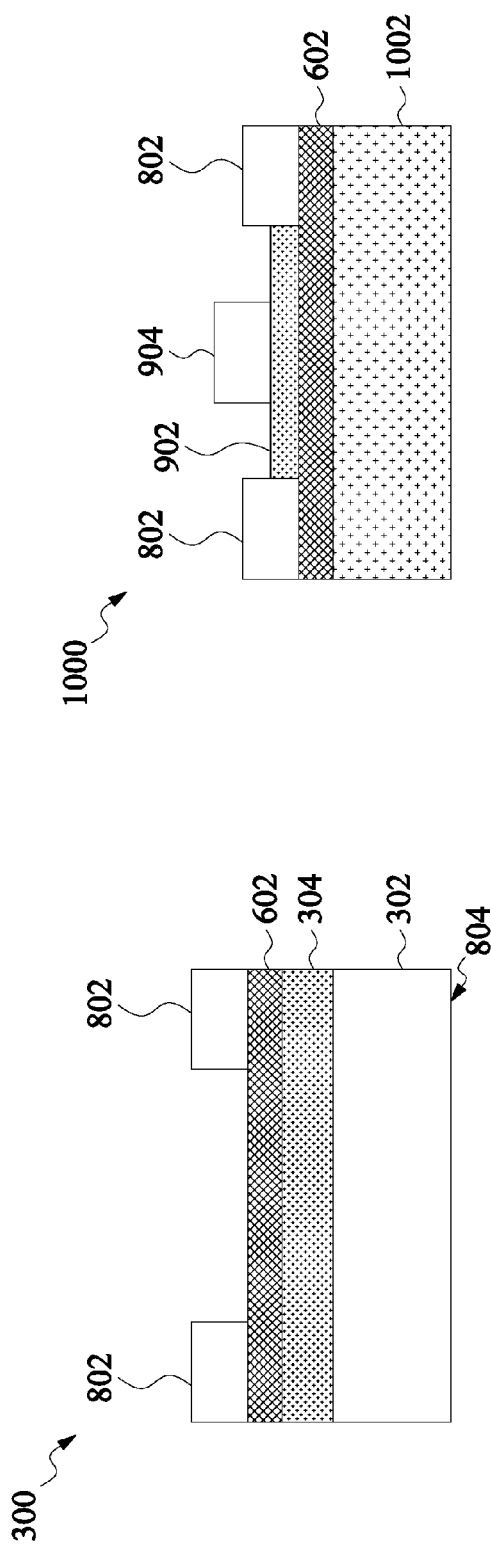

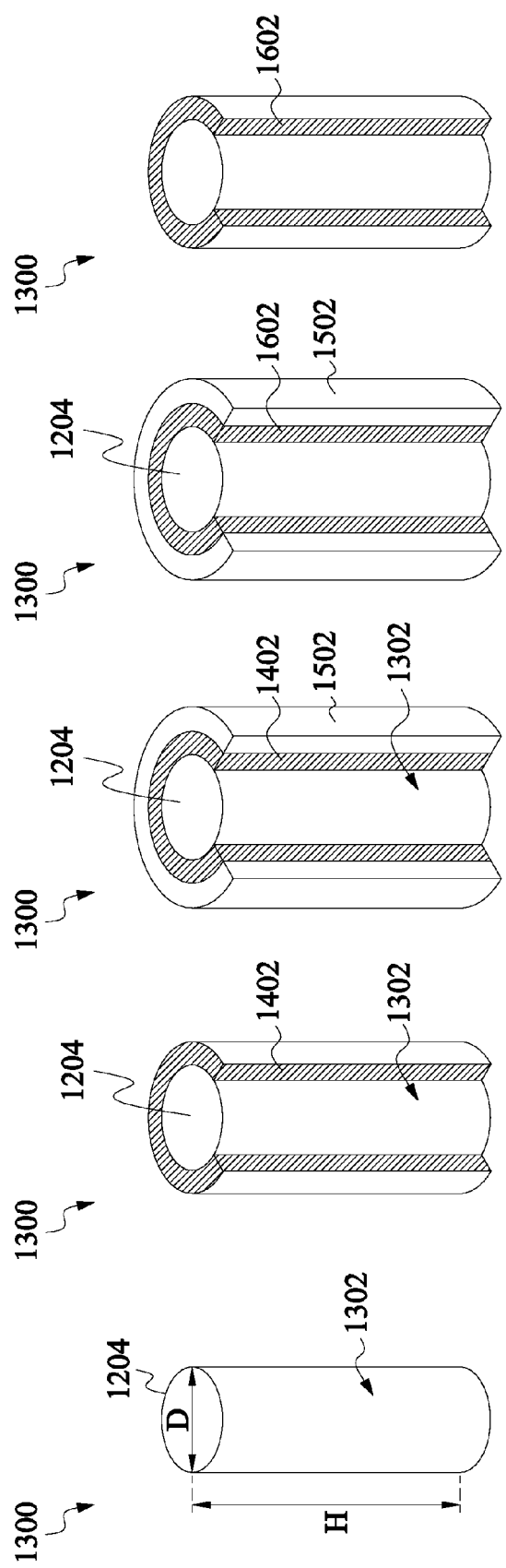

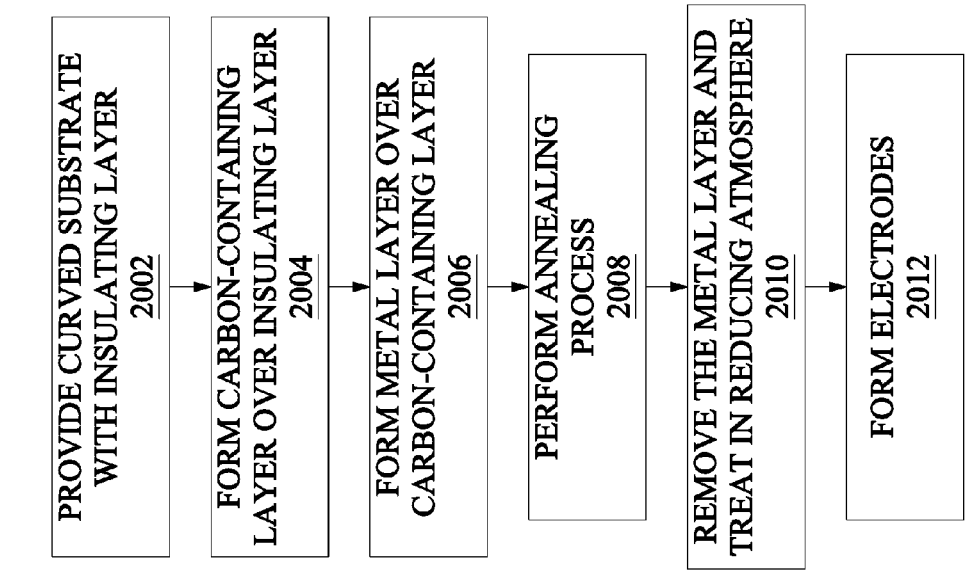
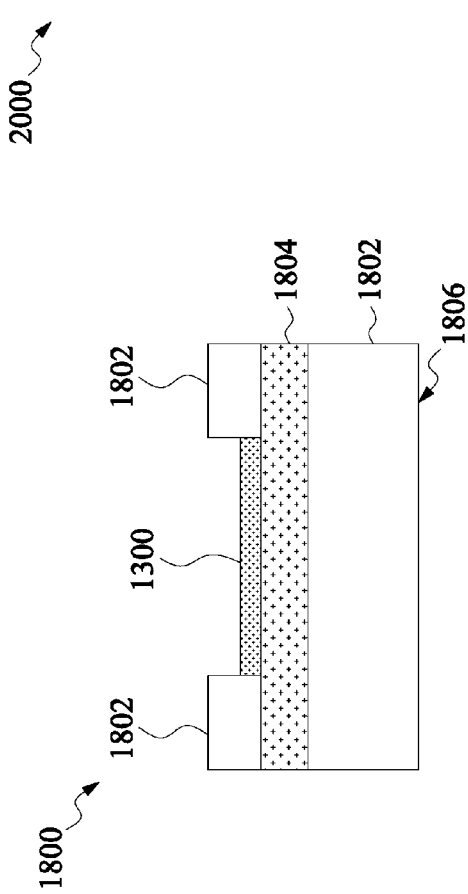
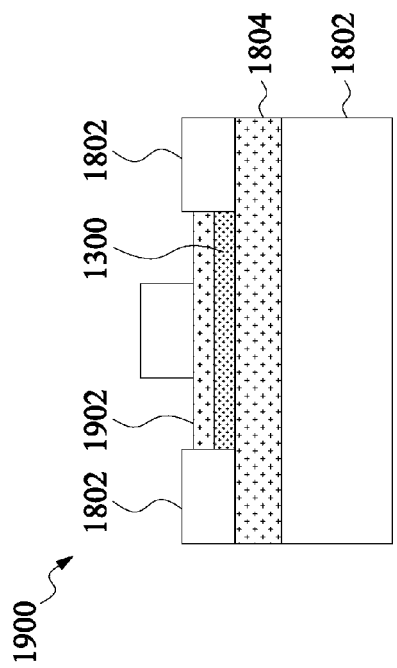

US 9,923,142 B2

METHODS OF GRAPHENE GROWTH AND RELATED STRUCTURES

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Graphene, a two-dimensional (2-D) sheet of carbon atoms bonded to one another in a hexagonal crystal lattice, has recently been introduced as a potential replacement channel material for transistor devices. In addition to its high intrinsic mobility, graphene has attracted great interest for its other unique properties such as large current densities, thermodynamic and mechanical stability, and high saturation velocity, among others. Graphene films have often been obtained by mechanical exfoliation (e.g., from a bulk graphite source), but mechanical exfoliation results in graphene films that are small (e.g., tens of microns) and non-scalable. Large-area graphene films have been produced by methods such as epitaxial growth on silicon carbide (SiC) substrates and chemical vapor deposition (CVD)-growth (e.g., involving the catalyzed decomposition of hydrocarbons on a metal surface), but such methods also have drawbacks (e.g., high-cost of SiC substrates and high processing temperature for SiC epitaxial growth). Regardless of the technique used for producing graphene films, the fabrication of graphene-based devices generally involves transfer of a graphene layer (e.g., from a growth substrate or from the bulk graphite source), and onto a target substrate upon which the graphene-based device will be fabricated. As a result of the transfer process, grain boundaries, point defects, wrinkles, folds, tears, cracks, impurities, or other defects may be introduced into the transferred graphene layer and thereby detrimentally affect the properties of any subsequently fabricated devices. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, and 8 illustrate cross sectional views of embodiments of a graphene device according to one or more aspects of the present disclosure and corresponding to one or more steps of the method of FIG. 2;

FIG. 9 is a cross-sectional view of a dual-gated graphene device according to one or more aspects of the present disclosure;

FIG. 10 is a cross-sectional view of a top-gated graphene device according to one or more aspects of the present disclosure;

FIGS. 12, 13, 14, 15, 16, and 17 illustrate cross sectional views of embodiments of the CNT according to one or more aspects of the present disclosure and corresponding to one or more steps of the method of FIG. 11;

FIG. 18 is a cross-sectional view of a back-gated CNT transistor according to one or more aspects of the present disclosure;

FIG. 19 is a cross-sectional view of a dual-gated CNT transistor according to one or more aspects of the present disclosure;

FIG. 20 is a flow chart of a method of fabricating curved graphene transistor according to one or more aspects of the present disclosure.

DETAILED DESCRIPTION

Figure 2:
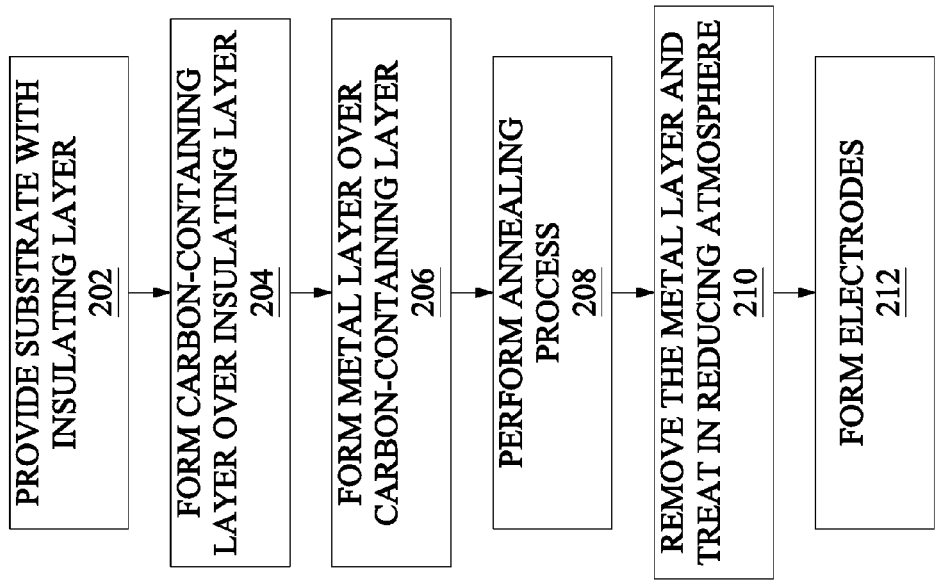
FIG. 2 is a flow chart of a method of fabricating a graphene device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
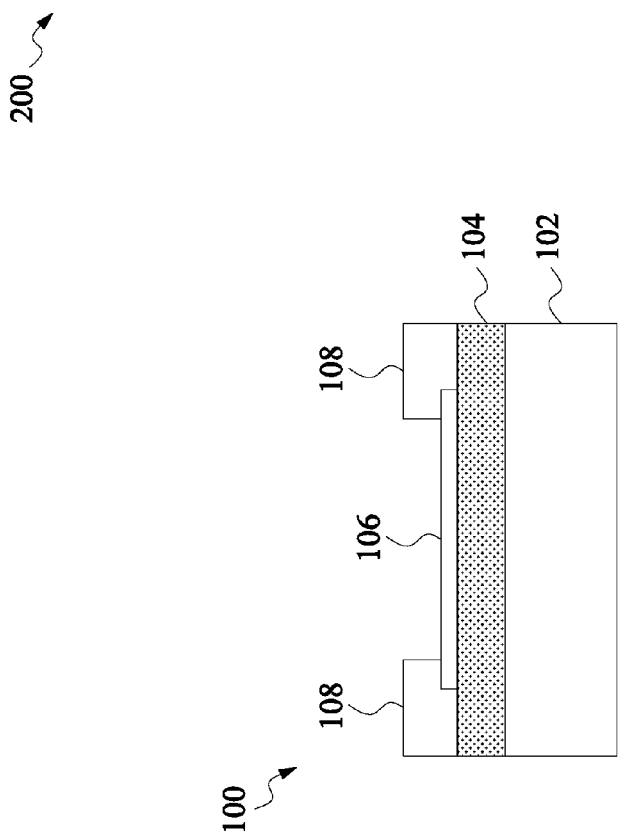
FIG. 1 is a cross-sectional view of a back-gated graphene device.

Illustrated in FIG. 1 is an exemplary back-gated graphene device 100. The graphene device 100 includes a substrate 102, an insulating layer 104 disposed on the substrate 102, a graphene layer 106 disposed on the insulating layer 104, and source/drain contacts 108 contacting the graphene layer 106. The substrate 102 may be a semiconductor substrate such as a silicon substrate. The substrate 102 may include various doping configurations depending on design requirements as is known in the art. By way of example, the substrate 102 may include a highly-doped, low-resistivity substrate that allows the substrate 102 to be used as a global back-gate for the graphene device 100.

The insulating layer 104 may include a silicon dioxide ($SiO_2$) layer grown by thermal oxidation over the substrate 102. In some cases, a thickness of the insulating layer 104 may be chosen so as to optimize the contrast of the graphene layer 106 with respect to the underlying substrate 102. By way of example, the insulating layer 104 may have a thickness of about 90 nanometers (nm) or 280 nm. In some cases, the insulating layer 104 may have a thickness in a range from about 90-100 nm, or from about 280-300 nm.

The graphene layer 106 may include graphene produced by a variety of methods such as epitaxial growth on silicon carbide (SiC) substrates, chemical vapor deposition (CVD)-growth (e.g., involving the catalyzed decomposition of hydrocarbons on a metal surface), and mechanical exfoliation (e.g., from a bulk graphite source), among others. By way of example, the grown or exfoliated graphene layer 106 may be transferred (e.g., from a growth substrate or from the bulk graphite source) onto the insulating layer 104 of the substrate 102, which may be referred to as a "target substrate", upon which one or more graphene-based devices may be fabricated. In various examples, the graphene transfer may be accomplished by a wet or dry transfer process. After transfer of the graphene layer 106 onto the insulating layer 104, metal source/drain contacts 108 may be formed. The metal source/drain contacts 108 may include a conductive layer such as Cr, Ti, Au, Ni, Pd, Ir, Ag, Pt, Cu, Co, Al, Fe, combinations thereof, and/or other suitable compositions. The source/drain contacts 108 may be formed using PVD, CVD, ALD, electron beam (e-beam) evaporation, and/or other suitable process. In some examples, a device 100 active region may be defined (e.g., prior to or after formation of the source/drain contacts 108) by an appropriate photolithography and etching process (e.g., an oxygen plasma etching process). Thus, the exemplary back-gated graphene device 100 of FIG. 1 includes the graphene layer 106 as the device channel, contacted by source/drain contacts 108, and the substrate 102 is a global back-gate separated from the graphene layer 106 by the insulating layer 104.

In various conventional methods, and as a result of the transfer of the graphene layer 106 onto the insulating layer 104, grain boundaries, point defects, wrinkles, folds, tears, cracks, impurities, or other defects may be introduced into the transferred graphene layer 106 and thereby degrade the properties of any subsequently fabricated devices, such as the device 100. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing uniform, large-area graphene by way of a transfer-free, direct-growth process. In accordance with embodiments of the present disclosure, a self-assembled monolayer (SAM) is used as a carbon source for direct graphene synthesis on a substrate. Thus, embodiments disclosed herein provide one or methods to avoid the introduction of defects into graphene, and graphene devices, which could occur as a result of conventional graphene transfer processes, as described above. For example, in various embodiments, a carbon-containing SAM, having a controlled number of carbon atoms therein, is formed on a substrate (e.g., an oxidized substrate), and a metal layer is formed over the SAM. The metal layer may serve as a catalytic metal (e.g., similar to the manner in which a metal layer is used for catalytic decomposition of hydrocarbons during CVD growth of graphene), whereby the carbon-containing SAM is converted to graphene following an appropriate annealing process. In various embodiments, the SAM is deposited using an atomic layer deposition (ALD) process, providing a highly conformal SAM having excellent step coverage on high-aspect ratio structures, and facilitating SAM deposition onto any of a variety of surfaces and/or surface topographies, such as curved surfaces and/or vertical sidewall surfaces, among others. For example, embodiments disclosed herein provide for SAM deposition (and subsequent graphene conversion of the SAM by way of the catalytic metal and annealing process) not only on planar surfaces, but also on surfaces (e.g., oxide surfaces) around the circumference of a nanorod (e.g., an outer surface of the nanorod), as well as on various other curved surfaces. In some embodiments, a carbon nanotube (CNT) having a controlled size (e.g., diameter, height), shape, and/or band gap, may be formed on the surface of a nanorod by appropriately tuning the geometry of the nanorod. Additionally, in some embodiments, a curved graphene transistor may be formed over a curved oxide surface, thereby providing a band gap in a channel region of the graphene transistor. Thus, embodiments of the present disclosure provide for the formation of high-quality, large-area graphene over any type of surface topography and/or surface structure, avoiding the challenges associated with conventional graphene transfer techniques, while also providing for the fabrication of CNT/graphene structures and devices having desirably tuned properties.

Referring now to FIG. 2, illustrated is a flow chart of a general method 200 of fabricating a graphene device according to one or more aspects of the present disclosure. The method 200 may be used to provide large-area graphene using a transfer-free, direct growth process, which can thereby be used to fabricate graphene devices having improved characteristics (e.g., as a result of avoiding graphene transfer-related defects). In some embodiments, the method 200 may be used to fabricate the device 100, described above with reference to FIG. 1. Thus, one or more aspects discussed above with reference to the device 100 may also apply to the method 200. Additionally, FIGS. 9-10 are cross sectional views of embodiments of a graphene device 300 according to one or more aspects of the present disclosure and corresponding to one or more steps of the method of FIG. 2. Additional embodiments of structures and methods in accordance with the present disclosure are discussed in more detail with reference to the methods of FIGS. 11 and 20 below.

It is understood that parts of the method 200 and/or the graphene device 300 may be fabricated by a well-known complementary metal-oxide-semiconductor (CMOS) technology process flow, and thus some processes are only briefly described herein. In addition, as described above, the device 300 may share aspects of the device 100, thus some aspects and/or processes of the device 300 are only discussed briefly for purposes of clarity in understanding. Further, the graphene device 300 may include, and/or may be integrated with various other devices and features, such as additional transistors, bipolar junction transistors, resistors, capacitors, diodes, fuses, etc., but is simplified for a better understanding of the inventive concepts of the present disclosure. Further, in some embodiments, the graphene device 300 includes a plurality of graphene devices (e.g., transistors), which may be interconnected.

In various embodiments, the graphene device 300 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof. In some embodiments, the graphene device 300 may be formed over a substrate (e.g., the substrate 102) having a dielectric layer (e.g., dielectric layer 104) disposed thereon, where the substrate may include CMOS transistors (or other devices mentioned above) formed within the substrate 102, and where electrodes of the graphene device 300 (e.g., source/drain contacts 108) and electrodes of devices within the substrate 102 may be connected through the dielectric layer by way of one or more contacts, vias, or other electrical interconnects.

Referring now to the method 200, the method 200 begins at block 202 where a substrate having an insulating layer is provided. Referring to the example of FIG. 3, and in an embodiment of block 202, illustrated therein is a device 300 including a substrate 302. The substrate 302 may be substantially similar to the substrate 102 discussed above with reference to the device 100 of FIG. 1. For example, the substrate 302 may be a semiconductor substrate such as a silicon substrate, and the substrate 302 may include various doping configurations depending on design requirements as is known in the art. In various embodiments, the substrate 302 may include a highly-doped (e.g., N+ or P+), low-resistivity substrate (e.g., less than 5 mOhm-cm) that allows the substrate 302 to be used as a global back-gate for the device 300. In a further embodiment of block 202, an insulating layer 304 may be formed over the substrate 302. The insulating layer 304 may be substantially similar to the insulating layer 104 discussed above with reference to the device 100 of FIG. 1. For example, the insulating layer 304 may include a $SiO_2$ layer grown by thermal oxidation over the substrate 302. However, other types of oxide layers (e.g., $Al_2O_3$) and/or other methods of oxide deposition may be used (e.g., PVD, CVD, ALD) without departing from the scope of the present disclosure. In some embodiments, the insulating layer 304 may have a thickness of about 90 nm or 280 nm. In some cases, the insulating layer 304 may have a thickness in a range from about 90-100 nm, or from about 280-300 nm. In various embodiments, the insulating layer 304 has a thickness that is sufficient to prevent the formation of silicides (e.g., during a subsequent annealing process), for example, between a subsequently deposited metal layer (e.g., metal layer 502) and the substrate 302.

Figure 4A:
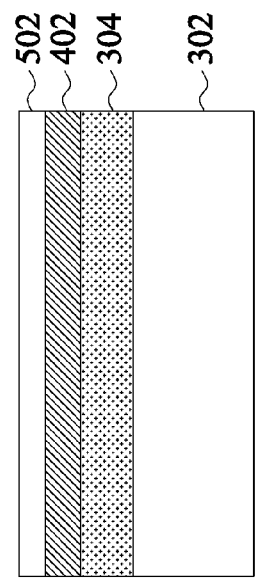
FIGS. 4A, 4B, and 4C illustrate chemical structures of precursors used to form silane-containing self-assembled monolayers (SAMs), according to one or more aspects of the present disclosure.
Figure 4B:
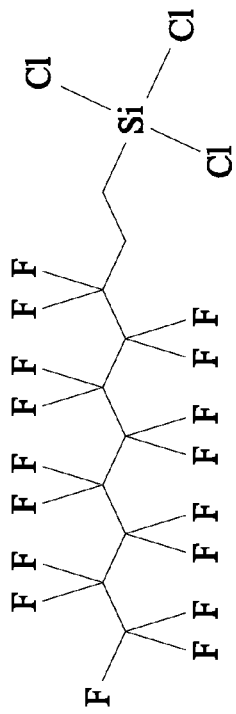
Figure 4C:
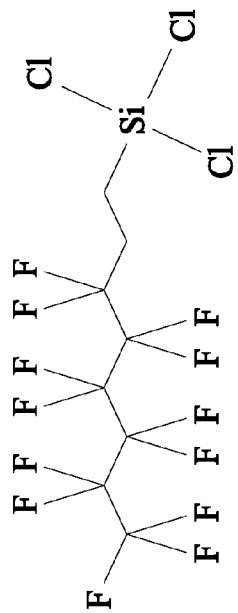

The method 200 then proceeds to block 204 where a carbon-containing layer is formed over the insulating layer. In some embodiments, the carbon-containing layer includes a SAM or other suitable carbon-containing layer formed using one or more suitable precursors, as described below. Referring to the example of FIG. 4, and in an embodiment of block 204, a carbon-containing layer 402 is formed over the insulating layer 304, thereby providing a carbon source for subsequent graphene layer formation. In some embodiments, prior to forming the carbon-containing layer 402 over the insulating layer 304, the surface of the insulating layer 304 may be cleaned (e.g., to remove organic residues). By way of example, in some embodiments, the device 300 may be soaked in a piranha solution (i.e., a mixture of sulfuric acid and hydrogen peroxide) to remove organic residues from a surface of the insulating layer 304. In some examples, the piranha solution clean may be performed multiple times and for any suitable duration. By way of example, and in some embodiments, after cleaning the insulating layer 304 using the piranha solution, the device 300 may be rinsed in ultrapure water (UPW), in an ultrasonic bath, to remove residues which may remain from the piranha solution clean. In some embodiments, the rinse/ultrasonic bath process may be performed multiple times and for any suitable duration.

In various embodiments, the carbon-containing layer 402 may be formed by a vapor phase deposition (VPD) technique such as ALD and/or molecular layer deposition (MLD). By way of example, the ALD and MLD techniques are both based on sequential, self-limiting surface reactions, and they may be used to deposit organic and inorganic materials. As such, embodiments of the present disclosure employing VPD techniques provide a variety of benefits. For example, VPD deposition of the carbon-containing layer 402 may provide a high degree of control over reactions (e.g., of precursors at a substrate surface) and layer self-assembly (e.g., without parasitic polymerization reactions). Moreover, VPD deposition provides for accurate control of a number of carbon atoms within the carbon-containing layer 402, directly impacting the thickness and quality of the subsequently formed graphene layer. In various embodiments, VPD layer deposition may also be accomplished in a relatively short duration (e.g., in minutes), for example, as compared to solution-based SAM formation (e.g., requiring hours). By way of example, VPD layer deposition is also effective at minimizing capillary effects, which helps to ensure a highly conformal carbon-containing layer 402 having excellent step coverage (e.g., on high-aspect ratio structures), and thereby facilitating deposition of the carbon-containing layer 402 onto any of a variety of surfaces and/or surface topographies, such as curved surfaces and/or vertical sidewall surfaces, among others. In various embodiments, the VPD layer deposition processes used and described herein are clean, vacuum-based processes, they are scalable and uniform over large surface areas, they have a low defect density and provide reproducible layers, and they may be used to provide heterogeneous organic and/or inorganic structures.

Returning to FIG. 4, and in various embodiments, the carbon-containing layer 402 may include a self-assembled monolayer (SAM) formed, for example, by a VPD method as described above. Self-assembled monolayers (SAMs), as discussed herein, may include ordered molecular assemblies that form spontaneously by adsorption of molecules on a solid substrate. By way of example, a SAM surfactant molecule may include a head group, an alkyl chain, and an end group (functional group). The head group may have a high affinity to the solid substrate, and may thus chemically interact with the substrate onto which it is deposited. In various embodiments, SAM molecules may adsorb at substantially all substrate surface sites, resulting in a close-packed monolayer. In some embodiments, a SAM head groups may include organosulfurs, thiols including —SH groups, or alkanethiols [X—$(CH_2)$n-SH] (e.g., when the underlying surface includes a metal such as Ag, Au, and Cu, or other appropriate metal) and silanes such as trichlorosilane (—$SiCl_3$), alkylsilane (—$Si(CH_3)_3$), or alkyltrichlorosilanes [X—$(CH_2)_n$—$SiCl_3$] (e.g., when the underlying surface includes an oxide layer such as $SiO_2$, $Al_2O_3$, and/or other oxide/dielectric material or dielectric substrate as described herein). In addition, Van der Waals interactions between SAM alkyl chains are effective to cause ordering of the SAMs. In various embodiments, the end group is exposed at a surface, for example, upon which the catalytic metal layer will be formed. By way of example, the end group may include non-polar (hydrophobic) or polar (hydrophilic) functional groups such as —$CH_3$, —OH, —COOH, —$NH_2$, etc., which also allows the SAM to be used for the modification of surface properties.

In some embodiments, the carbon-containing layer 402 may include a SAM formed using one or more precursors selected from the group including $CH_3(CH_2)_nSiX_3$, $(C_nH_{2n+2})_2SiX_2$, $(C_nH_{2n+2})_3SiX$, $COOH(CH_2)_nSiX_3$, $NH_2(CH_2)_nSiX_3$, $CH_3(CH_2)_nSi(OCH_3)_3$, $COOH(CH_2)_nSi(OCH_3)_3$, $NH_2(CH_2)_nSi(OCH_3)_3$, and $CF_3(CF_2)_n(CH_2)_2SiX_3$, where 'X' may include chlorine (Cl), bromine (Br), or iodine (I), and where 'n' has a value from about 1-26. In some examples, the carbon-containing layer 402 may include a single layer or a plurality of layers (e.g., a multilayer film) and may be formed using a VPD technique such as ALD and/or MLD. As discussed above, in various embodiments, the carbon-containing layer 402 may include a silane-containing SAM. For example, the carbon-containing layer 402 may include tridecafluoro-tetrahydrooctyl-trichlorosilane (FOTS), illustrated in FIG. 4A, which has a chemical formula $C_8H_4Cl_3F_{13}Si$, a boiling point of about 84 degrees Celsius, and a vapor pressure of about 4.2 Torr at 70 degrees Celsius. Additionally, in some examples, the carbon-containing layer 402 may include heptadecafluoro-tetrahydrodecyl-trichlorosilane (FDTS), illustrated in FIG. 4B, which has a chemical formula $C_{10}H_4Cl_3F_{17}Si$, a boiling point of about 216 degrees Celsius, and a vapor pressure of about 1.7 Torr at 80 degrees Celsius. In some cases, the carbon-containing layer 402 may include dodecyltrichlorosilane (DTS), illustrated in FIG. 4C, which has a chemical formula $C_{12}H_{25}Cl_3Si$, a boiling point of about 120 degrees Celsius, and a vapor pressure of about 0.5-1 Torr at 100 degrees Celsius.

In some embodiments, the carbon-containing layer 402 may include a SAM formed by molecular layer deposition (MLD) using one or more precursors selected from the group including (1E)-prop-1-ene-1,2,3-tricarboxylic acid, (2E,4E)-hexa-2,4-dienedioic acid, (2S)-2-aminopentanedioic acid, (E)-butenedioic acid, (Z)-butenedioic acid, 1,2-bis[(diamethylamino)dimethylsilyl]ethane, 1,4-diaminobenzene, 1,4-diisocyanatobenzene, 1,4-diisocyanatobutane, 1,4-diisothiocyanatobenzene, 2-aminoethanol, 2-oxepanone, 4,4'-oxydianiline, 4-aminophenol, 4-nitrobenzene-1,3-diamine, 7-octenyltrichlorosilane, 8-quinolinol, benzene-1,2,4,5-tetracarboxylic acid, benzene-1,2-dicarboxylic acid, benzene-1,3,5-tricarboxylic acid, benzene-1,3,5-triol, benzene-1,3-dicarboxylic acid, benzene-1,4-dicarboxylic acid, benzene-1,4-diol, benzoic acid, but-2-yne-1,4-diol, butane-1,4-diamine, butanedioic acid, decane-1,10-diamine, decanedioic acid, decanedioyl dichloride, ethane-1,2-diamine, ethane-1,2-diol, ethanedihydrazide, ethanedioic acid, ethanetetracarbonitrile, furan-2,5-dione, furo[3,4-f][2]benzofuran-1,3,5,7-tetrone, heptane-1,7-diamine, heptanedioic acid, hexa-2,4-diyne-1,6-diol, hexane-1,6-diamine, hexanedioyl dichloride, N-(2-aminoethyl)ethane-1,2-diamine, N,N-bis(2-aminoethyl)ethane-1,2-diamine, nonanedioyl dichloride, octane-1,8-diamine, octanedioic acid, octanedioyl dichloride, oxiran-2-ylmethanol, pentanedioic acid, propane-1,2,3-tricarboxylic acid, propane-1,2,3-triol, propanedioic acid, propanedioyl dichloride, terephthalaldehyde, terephthalic acid, bis(2-hydroxyethyl) ester, terephthaloyl dichloride, tris(2-aminoethyl) amine, and tris(2-hydroxyethyl)amine.

While some examples of precursors and/or materials useful for forming the carbon-containing layer 402 (e.g., a SAM formed by way of ALD and/or MLD) have been given, the examples provided are not meant to be limiting in any way, and it will be understood that other materials may be used to form the carbon-containing layer 402 without departing from the scope of the present disclosure.

Figure 5:
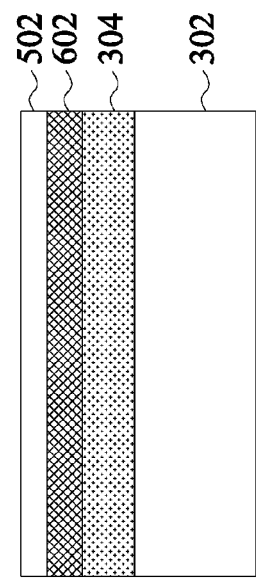

The method 200 then proceeds to block 206 where a metal layer is formed over the carbon-containing layer. Referring to the example of FIG. 5, and in an embodiment of block 206, a metal layer 502 is formed over the carbon-containing layer 402 (e.g., the SAM). In various embodiments, the metal layer 502 may include Ni, Cu, Pt, Fe, Co, Au, a Cu—Ni alloy, or combinations thereof. As referred to above, the metal layer 502 serves to facilitate the metal-catalyzed crystallization of carbon of the carbon-containing layer 402 during a subsequent anneal process (block 208), thereby converting the carbon-containing layer 402 to a graphene layer. In various embodiments, the metal layer 502 may be formed using PVD, CVD, ALD, electron beam (e-beam) evaporation, and/or other suitable process. In some embodiments, the metal layer 502 may have a thickness of about 10 nm-500 nm.

Figure 6:
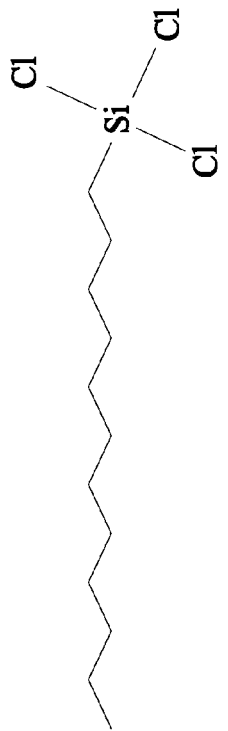

The method 200 then proceeds to block 208 where an anneal process is formed. Referring to the example of FIGS. 5 and 6, and in an embodiment of block 208, the device 300 may be annealed in order to convert the carbon-containing layer 402 (FIG. 5) to a graphene layer 602 (FIG. 6). In various embodiments, the conversion of the carbon-containing layer 402 to the graphene layer 602 is achieved by pyrolysis. As shown in FIG. 6, and as a result of the anneal process, the graphene layer 602 is formed between the metal layer 502 (e.g., the catalytic metal) and the insulating layer 304. In some examples, the anneal process may be performed in a hydrogen atmosphere, an argon atmosphere, a nitrogen atmosphere, or a combination thereof such as a $H_2$/Ar atmosphere. By way of example, the annealing process of block 208 may be performed using thermal radiation (e.g., thermal oven), using heat conduction (e.g., hot plate), using an optoelectronic method (e.g., laser annealing), or other appropriate method. In various embodiments, and depending in part on the thickness of the metal layer 502, the composition of the carbon-containing layer 402, and the annealing parameters (e.g., time, temperature, atmosphere, pressure, etc.), the graphene layer 602 may include monolayer graphene, bilayer graphene, or multi-layer graphene (e.g., including more than two layers). In some embodiments, the anneal process of block 208 may be performed at a temperature from about 600-1200 degrees Celsius. In some embodiments, the anneal process of block 208 may be performed for a duration of between about 1-60 minutes.

The method 200 then proceeds to block 210 where the metal layer is removed and a thermal treatment in a reducing atmosphere is performed. Referring to the example of FIGS. 6 and 7, and in an embodiment of block 210, the metal layer 502 may be removed. In various embodiments, and depending on the material used for the metal layer 502 (e.g., Ni, Cu, Pt, Fe, Co, Au, a Cu—Ni alloy, or combinations thereof), the metal layer 502 may be removed using an etching solution including, for example, ferric chloride ($FeCl_3$), hydrochloric acid (HCl), nitric acid ($HNO_3$), ammonium persulfate $(NH_4)_2S_2O_8$, or other metal etching solutions as known in the art. Thus, as shown in FIG. 7, the graphene layer 602 has been directly formed on the insulating layer 304 using a transfer-free process. After removal of the metal layer 502, and in a further embodiment of the block 210, the now exposed graphene layer 602 may be thermally treated in a reducing atmosphere. For example, in some embodiments, the device 300 may be annealed at a temperature of about 800-1200 degrees Celsius in a $H_2$/Ar atmosphere, in a $H_2/N_2$ atmosphere, in a $N_2H_2$ atmosphere, or in another appropriate reducing atmosphere.

The method 200 then proceeds to block 212 where electrodes are formed. Referring to the example of FIG. 8, after performing the thermal treatment in the reducing atmosphere and in an embodiment of block 212, source/drain electrodes 802 may be formed over the graphene layer 602. In some embodiments, the source/drain electrodes 802 may include a conductive layer such as Cr, Ti, Au, Ni, Pd, Ir, Ag, Pt, Cu, Co, Al, Fe, combinations thereof, and/or other suitable compositions. In various embodiments, the source/drain electrodes 802 may be formed using PVD, CVD, ALD, electron beam (e-beam) evaporation, and/or other suitable process. In some examples, the source/drain electrodes 802 may be formed using a metal lift-off process. In some examples, a device 300 active region may be defined (e.g., prior to or after formation of the source/drain electrodes 802) by an appropriate photolithography and etching process (e.g., an oxygen plasma etching process). Thus, the device 300 of FIG. 8 includes a back-gated graphene device, where the directly formed, transfer-free graphene layer 602 is contacted by source/drain electrodes 802, and the substrate 302 serves as a global back-gate separated from the graphene layer 602 by the insulating layer 304. In some cases, a metal layer (e.g., Al) may be evaporated onto a surface 804 of the substrate 302 in order to improve contact to the substrate 302.

The device 300 may undergo further processing to form various features and regions known in the art. For example, subsequent processing may form various contacts/vias/lines and multilayers interconnect features (e.g., metal layers and interlayer dielectrics) on the substrate 302, configured to connect the various features to form a functional circuit that may include one or more graphene devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. In some embodiments, the graphene device 300 may be formed over a substrate having a dielectric layer disposed thereon, where the substrate may include CMOS transistors (or other devices mentioned above) formed within the substrate, and where electrodes of the graphene device 300 (e.g., source/drain electrodes 802) and electrodes of devices within the substrate may be connected through the dielectric layer by way of one or more contacts, vias, or other electrical interconnects. Moreover, additional process steps may be implemented before, during, and after the method 200, and some process steps described above may be replaced or eliminated in accordance with various embodiments of the method 200.

With reference now to FIG. 9, illustrated therein is a cross-sectional view of a dual-gated graphene device 900 according to one or more aspects of the present disclosure. In various embodiments, the device 900 may be processed in a manner substantially similar to the device 300 described above with respect to the method 200. By way of illustration, after formation of the back-gated device, as shown in FIG. 8, additional processing may be performed to fabricate the dual-gated device of FIG. 9. For example, in some embodiments, after formation of the source/drain electrodes 802, a top-gate dielectric layer 902 may be formed over the graphene layer 602. Due to the inert nature of graphene, in some examples, a nucleation and/or functionalization layer (or nucleation/functionalization treatment) may be formed (or performed) prior to formation of the dielectric layer 902 in order to enable the deposition of the dielectric layer 902 onto the graphene layer 602. Merely for purposes of illustration, in some embodiments, an Al nucleation layer may be formed prior to deposition of an $Al_2O_3$ layer. For further illustration, in some examples, an ozone ($O_3$) pre-treatment may be performed prior to deposition of the dielectric layer 902. While some examples of forming a nucleation layer on graphene, or of performing a functionalization treatment, have been provided, these examples are not meant to be limiting in any way, and those of skill in the art will recognize other nucleation layers and/or functionalization treatments that may be performed without departing from the scope of the present disclosure.

In various embodiments, the dielectric layer 902 may include a high-K dielectric layer. High-K dielectrics, as used and described herein, include dielectric materials having a high dielectric constant, for example, greater than that of thermal silicon oxide (~3.9). In various embodiments, the high-K dielectric layer of the dielectric layer 902 may include a dielectric layer such as $HfO_2$, $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. In some embodiments, the high-K dielectric layer of the dielectric layer 902 may be formed by ALD, physical vapor deposition (PVD), CVD, chemical oxidation, thermal oxidation, and/or other suitable methods.

Still referring to FIG. 9, after formation of the dielectric layer 902, a top-gate electrode 904 may be formed. By way of example, in some embodiments, the top-gate electrode 904 may include a conductive layer such as W, TiN, TaN, WN, Re, Ir, Ru, Mo, Al, Cu, Co, Ni, Cr, Ti, Au, Pd, Ag, Pt, Fe, combinations thereof, and/or other suitable compositions. In some embodiments, the top-gate electrode 904 may alternately include a polysilicon layer. The top-gate electrode 904 may be formed using PVD, CVD, ALD, electron beam (e-beam) evaporation, and/or other suitable process. In some examples, the top-gate electrode 904 may be formed using a metal lift-off process. Thus, the device 900 of FIG. 9 provides a dual-gate structure, including the directly formed, transfer-free graphene layer 602 (device channel), and including the substrate 302 as the global back-gate and the top-gate electrode 904 as a top-gate.

Referring to FIG. 10, illustrated therein is a cross-sectional view of a top-gated graphene device 1000 according to one or more aspects of the present disclosure. In various embodiments, aspects of the device 1000 may be formed in a manner similar to the device 300 described above with respect to the method 200, and/or as discussed above with reference to the device 900 of FIG. 9. By way of illustration, and in an embodiment of block 204 of the method 200, the carbon-containing layer 402 is formed over an insulating layer. However, in the example of FIG. 10, the insulating layer (on which the graphene layer is directly formed) includes an insulating substrate 1002. For example, in various embodiments, the insulating substrate 1002 may include quartz, glass, ceramic, sapphire, silicon carbide (SiC), as well as other insulating or semi-insulating substrates as known in the art. In at least some embodiments, an insulating substrate may be beneficial for radio-frequency (RF) graphene devices. After direct growth of the graphene layer 602 to the insulating substrate 1002, using a transfer-free process as described above, the device 1000 may be processed substantially the same as described above. For example, the annealing process may be performed (block 208), the source/drain electrodes 802 may be formed, and the dielectric layer 902/top-gate 904 may be formed. Thus, the device 1000 of FIG. 10 provides a top-gate structure including the directly formed, transfer-free graphene layer 602 (device channel), and the top-gate electrode 904 as a top-gate. It is noted that the device 1000 does not include a global back-gate due to the insulating substrate 1002.

Figure 11:
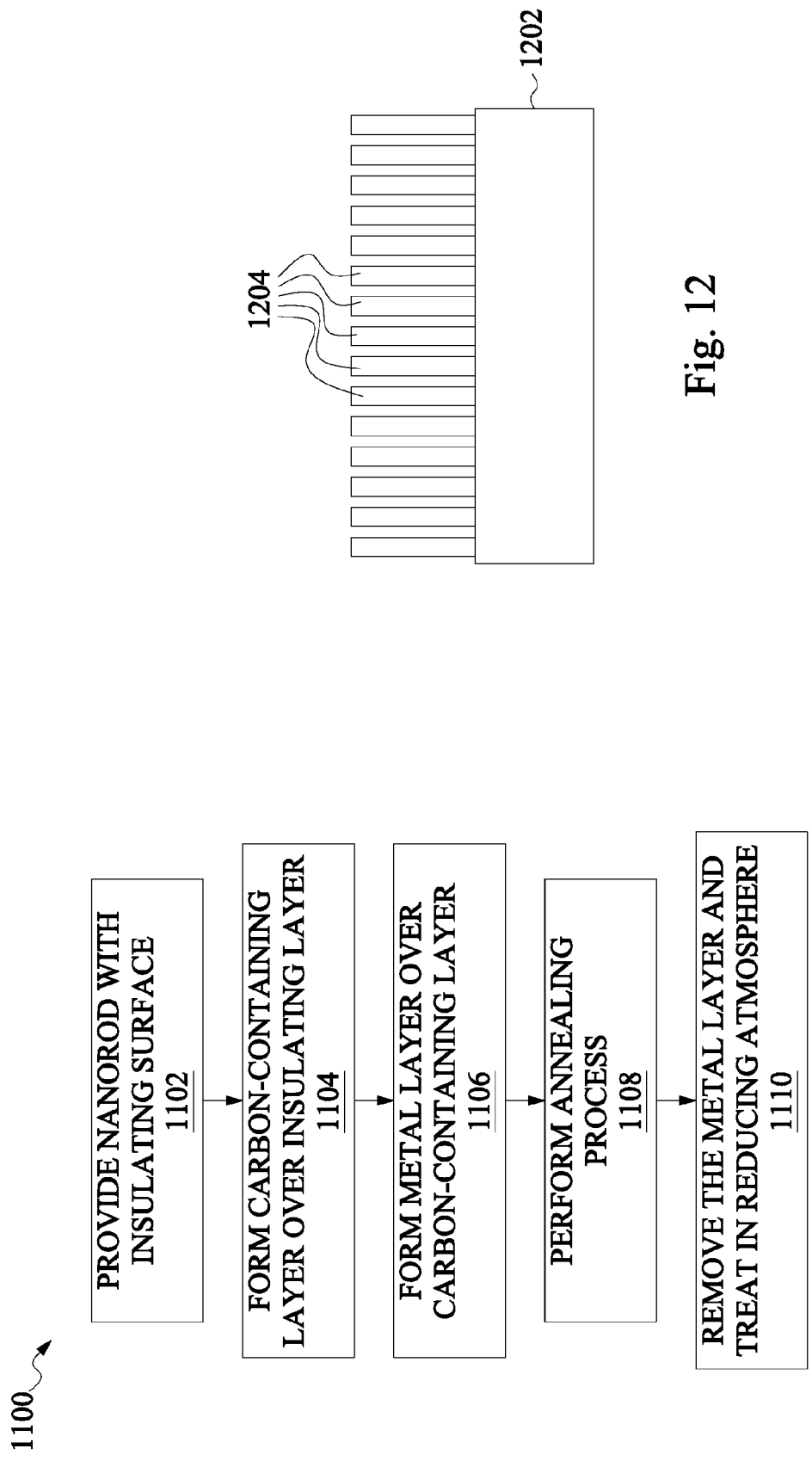
FIG. 11 is a flow chart of a method of fabricating a carbon nanotube (CNT) according to one or more aspects of the present disclosure.

Referring now to FIG. 11, illustrated is a flow chart of a method 1100 of fabricating a carbon nanotube (CNT) having a controlled size (e.g., diameter, height, etc.), and related device, according to one or more aspects of the present disclosure. The method 1100 shares various features with the method 200 discussed above, while providing additional embodiments in accordance with the present disclosure. As described below, in some embodiments, the method 1100 may be used to provide graphene around a circumference of a nanorod (e.g., an outer surface of the nanorod) having an insulating (e.g., oxide) surface by way of the transfer-free, direct growth process, thereby forming a CNT that conforms to the geometry of the insulating nanorod surface. In various embodiments, one or more aspects discussed above with reference to the device 300 may also apply to the method 1100. Additionally, FIGS. 18-19 are cross sectional views of embodiments of a CNT transistor according to one or more aspects of the present disclosure and corresponding to one or more steps of the method of FIG. 11.

It is understood that parts of the method 1100 and/or the CNT device 1300 may be fabricated by a well-known complementary metal-oxide-semiconductor (CMOS) technology process flow, and thus some processes are only briefly described herein. In addition, as described above, the CNT device 1300 may share aspects of the device 300, thus some aspects and/or processes of the device 1300 are only discussed briefly for purposes of clarity in understanding. Further, the CNT device 1300 may include, and/or may be integrated with various other devices and features, such as additional transistors, bipolar junction transistors, resistors, capacitors, diodes, fuses, etc., but is simplified for a better understanding of the inventive concepts of the present disclosure. Further, in some embodiments, the CNT device 1300 includes a plurality of graphene devices (e.g., transistors), which may be interconnected.

Figure 12:
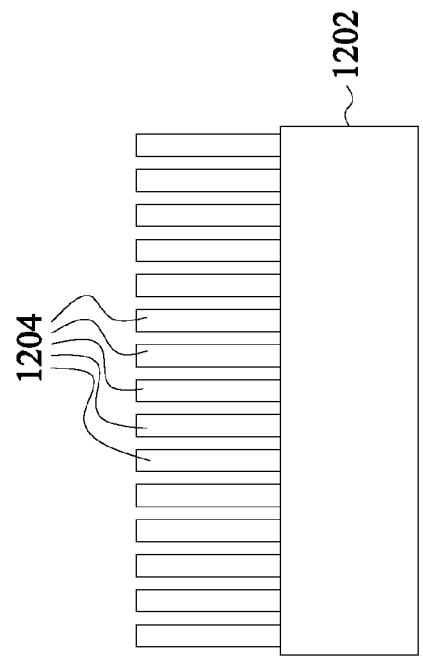

The method 1100 begins at block 1102 where a nanorod with an insulating surface (e.g., an oxide surface) is formed. Referring to the example of FIG. 12, and in an embodiment of block 1102, illustrated therein is a substrate 1202 including a plurality of nanorods 1204 (e.g., a nanorod array) extending therefrom, wherein the nanorods 1204 have insulating surfaces. While the embodiments are discussed herein as nanorods, it is understood that other one-dimensional nanostructures such as nanowires or nanopillars may equally be used without departing from the scope of the present disclosure. In some embodiments, the substrate 1202 may be substantially similar to the substrate 302 or the substrate 102 discussed above. For example, the substrate 1202 may be a semiconductor substrate such as a silicon substrate, and the substrate 1202 may include various doping configurations depending on design requirements as is known in the art. In various embodiments, the nanorods 1204 may be formed by any suitable technique including top-down or bottom-up approaches, and including lithography and etching, anodic aluminum oxide (AAO) templates, colloidal templates, solution-based growth, vapor-based growth, or other suitable technique as known in the art. Additionally, in various examples, the nanorods 1204 may initially be formed as metallic nanorods, semiconducting nanorods, or insulating nanorods, and an insulating layer may be subsequently formed over the nanorod 1204 surface. With reference to the example of FIG. 13, illustrated therein is the CNT device 1300 including an individual nanorod 1204 (e.g., of the nanorod array shown in FIG. 12), where the nanorod 1204 has an insulating surface. For the sake of clarity, the discussion that follows will be provided with reference to the individual nanorod 1204, as illustrated in FIG. 13. Generally, after nanorod formation and in some embodiments, an insulating layer (e.g., an oxide layer) may be formed over the surface of the nanorod such that irrespective of the type of nanorod initially formed (e.g., metallic, semiconducting, insulating), the nanorod 1204 will have an insulating surface 1302 formed thereupon. In some cases, for example if the initially formed nanorod 1204 includes an insulating nanorod, then an additional insulating layer formed over the surface of the nanorod 1204 may be optional. By way of example, the insulating layer used to form the insulating surface 1302 may include $SiO_2$, $Al_2O_3$, or other appropriate insulating layer, and the insulating layer may be deposited over the nanorod surface by thermal oxidation, CVD, ALD, PVD, or other suitable technique. In accordance with embodiments of the present disclosure, dimensions of the nanorod 1204 (e.g., diameter, height, etc.), as well as the thickness of any insulating layer deposited on the nanorod 1204, may be selected so as to define a geometry of a nanorod with an insulating surface upon which a CNT will be formed. With reference to FIG. 13, the geometry of the nanorod 1204 with the insulating surface may be defined at least in part by a diameter 'D' and a height 'H'. Thus, in accordance with various embodiments, a CNT having a controlled diameter 'D' may be fabricated, based on the geometry of the nanorod 1204 with the insulating surface. Moreover, it is known that CNT band gap (e.g., at least for single-wall CNTs) varies as a function of CNT diameter. Thus, in accordance with some embodiments, a CNT having a controlled band gap may be fabricated, thereby ensuring formation of an appropriate semiconducting CNT for subsequent transistor fabrication.

The method 1100 then proceeds to block 1104 where a carbon-containing layer is formed over the insulating layer. Referring to the example of FIG. 14, and in an embodiment of block 1104, a carbon-containing layer 1402 is formed over the insulating surface 1302 of the nanorod 1204, thereby providing a carbon source for subsequent graphene layer formation around the circumference of the nanorod 1204 (e.g., an outer surface of the nanorod). In some embodiments, prior to forming the carbon-containing layer 1402 over the insulating surface 1302 of the nanorod 1204, the insulating surface 1302 of the nanorod 1204 may be cleaned (e.g., to remove organic residues), for example, using a piranha solution and UPW rinse as described above.

In various embodiments, the composition and method of formation of the carbon-containing layer 1402 is substantially the same as the carbon-containing layer 402 discussed above with reference to the method 200. Thus, in some embodiments, the carbon-containing layer 1402 may likewise include a SAM or other suitable carbon-containing layer formed using one or more suitable precursors, as described above. In at least some embodiments, the carbon-containing layer 1402 includes a silane-based SAM, as described above. Additionally, the carbon-containing layer 1402 may also be formed by a VPD technique such as ALD and/or MLD, thereby effectively forming the carbon-containing layer 1402 on the surface 1302 of the nanorod 1204 (e.g., an outer surface of the nanorod traversing the circumference of the nanorod 1204). In various examples, any of the precursors and/or materials discussed above as useful for forming the carbon-containing layer 402 (e.g., by way of ALD and/or MLD) for the device 300 may likewise be used to form the carbon-containing layer 1402 for the device 1300.

The method 1100 then proceeds to block 1106 where a metal layer is formed over the carbon-containing layer. Referring to the example of FIG. 15, and in an embodiment of block 1106, a metal layer 1502 is formed over the carbon-containing layer 1402 (e.g., the SAM). In various embodiments, the metal layer 1502 may include Ni, Cu, Pt, Fe, Co, Au, a Cu—Ni alloy, or combinations thereof. As discussed above, the metal layer 1502 serves to facilitate the metal-catalyzed crystallization of carbon of the carbon-containing layer 1402 during a subsequent anneal process (block 1108), thereby converting the carbon-containing layer 1402 to a graphene layer wrapped around the nanorod 1204, thereby effectively forming a CNT around the circumference of the nanorod 1204. In various embodiments, the metal layer 1502 may be formed using PVD, CVD, ALD, electron beam (e-beam) evaporation, and/or other suitable process.

The method 1100 then proceeds to block 1108 where an anneal process is formed. Referring to the example of FIGS. 15 and 16, and in an embodiment of block 1108, the CNT device 1300 may be annealed in order to convert the carbon-containing layer 1402 (FIG. 15) to a CNT 1602 (FIG. 16). In various embodiments, the conversion of the carbon-containing layer 1402 to the CNT 1602 is achieved by pyrolysis. As shown in FIG. 16, and as a result of the anneal process, the CNT 1602 is formed between the metal layer 1502 (e.g., the catalytic metal) and the insulating surface 1302 of the nanorod 1204. In some examples, the anneal process may be performed in a hydrogen atmosphere, an argon atmosphere, a nitrogen atmosphere, or a combination thereof such as a $H_2$/Ar atmosphere. By way of example, the annealing process of block 1108 may be performed using thermal radiation (e.g., thermal oven), using heat conduction (e.g., hot plate), using an optoelectronic method (e.g., laser annealing), or other appropriate method. In various embodiments, and depending in part on the thickness of the metal layer 1502, the composition of the carbon-containing layer 1402, and the annealing parameters (e.g., time, temperature, atmosphere, pressure, etc.), the CNT 1602 may include monolayer CNT (e.g., single-wall CNT), bilayer CNT (e.g., double-wall CNT), or multi-layer CNT (e.g., multi-wall CNT).

The method 1100 then proceeds to block 1110 where the metal layer is removed and a thermal treatment in a reducing atmosphere is performed. Referring to the example of FIGS. 16 and 17, and in an embodiment of block 1110, the metal layer 1502 may be removed. In various embodiments, and depending on the material used for the metal layer 1502 (e.g., Ni, Cu, Pt, Fe, Co, Au, a Cu—Ni alloy, or combinations thereof), the metal layer 1502 may be removed using an etching solution including, for example, ferric chloride ($FeCl_3$), hydrochloric acid (HCl), nitric acid ($HNO_3$), ammonium persulfate $(NH_4)_2S_2O_8$, or other metal etching solutions as known in the art. Thus, as shown in FIG. 17, the CNT 1602 has been directly formed on the insulating surface 1302 of the nanorod 1204 using a transfer-free process. After removal of the metal layer 1502, and in a further embodiment of the block 1110, the now exposed CNT 1602 may be thermally treated in a reducing atmosphere. For example, in some embodiments, the CNT device 1300 may be annealed at a temperature of about 800-1200 degrees Celsius in a $H_2$/Ar atmosphere, in a $H_2$/$N_2$ atmosphere, in a $N_2H_2$ atmosphere, or in another appropriate reducing atmosphere.

The device 1300 may undergo further processing to form various features and regions known in the art. For example, subsequent processing may be performed to fabricate a CNT transistor using the device 1300. For example, FIGS. 18-19 are cross sectional views of embodiments of a CNT transistor 1800 and a CNT transistor 1900, according to one or more aspects of the present disclosure. The CNT transistor 1800 may be similar in some aspects to the device 300 of FIG. 8, where the graphene layer 602 is replaced with the device 1300 (CNT channel), which in some examples, may be transferred onto an insulating substrate or substrate having an insulating layer formed thereupon. Thus, by way of example, the CNT transistor 1800 of FIG. 18 may include a back-gated CNT transistor, where the device 1300 is contacted by source/drain electrodes 1802, and a substrate 1802 serves as a global back-gate separated from the device 1300 by an insulating layer 1804. In some cases, a metal layer (e.g., Al) may be evaporated onto a surface 1806 of the substrate 1802 in order to improve contact to the substrate 1802. Similarly, the CNT transistor 1900 may be similar in some aspects to the device 900 of FIG. 9, where the CNT transistor 1900 provides a dual-gate structure, including the device 1300 contacted by source/drain electrodes 1802, the substrate 1802 as a global back-gate separated from the device 1300 by the insulating layer 1804, a top-gate dielectric layer 1902 formed over the device 1300, and top-gate electrode 1904 formed over the top-gate dielectric layer 1902. In various embodiments, the top-gate dielectric layer 1902 and top-gate electrode 1904 may include one or more materials, and be formed by one or more methods, as described above. In some embodiments, a CNT device 1300 may also be used to fabricate a top-gated CNT transistor, where the substrate includes an insulating substrate (e.g., for RF applications), such as described above with reference to FIG. 10.

In various aspects, the device 1300 and/or the CNT transistors 1800, 1900 may undergo further processing to form various contacts/vias/lines and multilayers interconnect features (e.g., metal layers and interlayer dielectrics), for example, configured to connect the various features to form a functional circuit that may include one or more CNT devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. In some embodiments, the CNT transistors 1800, 1900 may be formed over a substrate having a dielectric layer disposed thereon, where the substrate may include CMOS transistors (or other devices mentioned above) formed within the substrate, and where electrodes of the CNT transistors 1800, 1900 (e.g., source/drain electrodes 1802) and electrodes of devices within the substrate may be connected through the dielectric layer by way of one or more contacts, vias, or other electrical interconnects. Moreover, additional process steps may be implemented before, during, and after the method 1100, and some process steps described above may be replaced or eliminated in accordance with various embodiments of the method 1100.

Referring now to FIG. 20, illustrated is a flow chart of a method 2000 of fabricating a curved graphene transistor 2100, according to one or more aspects of the present disclosure. The method 2000 shares various features with the method 200 discussed above, while providing additional embodiments in accordance with the present disclosure. As described below, in some embodiments, the method 2000 may be used to form graphene over a curved oxide surface, by way of the transfer-free, direct growth process disclosed herein, thereby providing a band gap in a channel region of the graphene transistor. In various embodiments, one or more aspects discussed above with reference to the device 300 may also apply to the method 2000.

It is understood that parts of the method 2000 and/or the curved graphene transistor 2100 may be fabricated by a well-known complementary metal-oxide-semiconductor (CMOS) technology process flow, and thus some processes are only briefly described herein. In addition, as described above, the curved graphene transistor 2100 may share aspects of the device 300, thus some aspects and/or processes of the curved graphene transistor 2100 are only discussed briefly for purposes of clarity in understanding. Further, the curved graphene transistor 2100 may include, and/or may be integrated with various other devices and features, such as additional transistors, bipolar junction transistors, resistors, capacitors, diodes, fuses, etc., but is simplified for a better understanding of the inventive concepts of the present disclosure. Further, in some embodiments, the curved graphene transistor 2100 includes a plurality of curved graphene devices (e.g., transistors), which may be interconnected.

Figure 21:
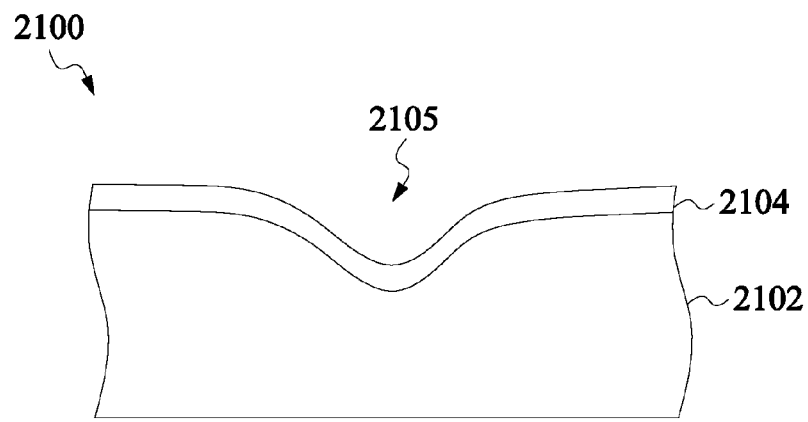
FIGS. 21, 22, 23, 24, 25, 26, 27, and 28 illustrate cross sectional views of embodiments of the curved graphene transistor according to one or more aspects of the present disclosure and corresponding to one or more steps of the method of FIG. 20.
Figure 22:
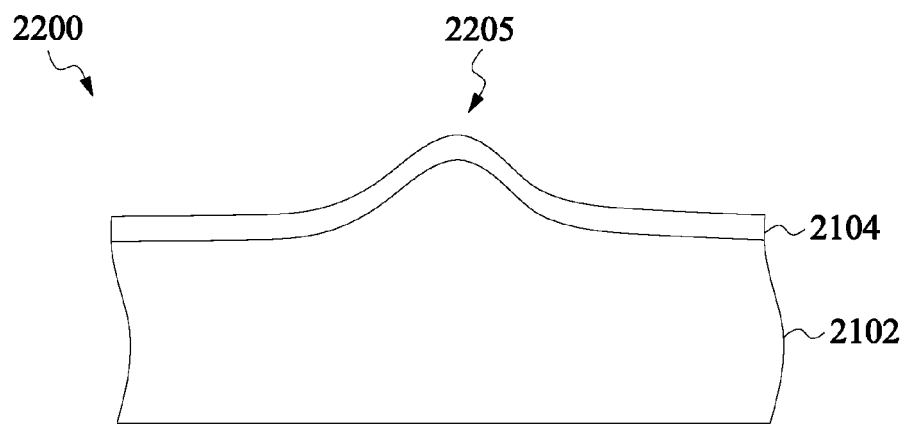

The method 2000 begins at block 2002 where a curved substrate having an insulating layer is provided. Referring to the example of FIG. 21, and in an embodiment of block 2002, illustrated therein is a device 2100 including a substrate 2102 having a curved region 2105 (e.g., a concave region 2105). In various embodiments, the concave curved region 2105 may be formed, for example, by a lithography process, a wet etch process, a dry etch process, a combination thereof, and/or other suitable process. The substrate 2102 may be substantially similar to the substrate 302 discussed above with reference to the device 300 of the method 200 of FIG. 2. Thus, the substrate 2102 may similarly include a highly-doped (e.g., N+ or P+), low-resistivity substrate (e.g., less than 5 mOhm-cm) that allows the substrate 2102 to be used as a global back-gate for the device 2100. In a further embodiment of block 2002, and again similar to the device 300, an insulating layer 2104 may be formed over the substrate 2102. The insulating layer 2104 may be substantially similar to the insulating layer 304 discussed above with reference to the device 300. Additionally, as shown in FIG. 21, the insulating layer 2104 may conform to the substrate 2102, such that the insulating layer 2104 also follows a surface contour of the substrate curved region 2105. As described above, the thickness of the insulating layer 2104 is thick enough to prevent the formation of silicides (e.g., during a subsequent annealing process). With reference to the example of FIG. 22, and in an additional embodiment of block 2002, a device 2200 including a substrate 2102 having a curved region 2205 may be provided, where the curved region 2205 includes a convex region 2205 (e.g., in contrast to the concave region 2105 of FIG. 21). In various embodiments, the convex curved region 2205 may be formed, for example, by a lithography process, a deposition process, a wet etch process, a dry etch process, a combination thereof, and/or other suitable process. For purposes of the discussion that follows, the method 2000 will be primarily discussed with reference to the device 2100 including the concave curved region 2105.

Figure 23:
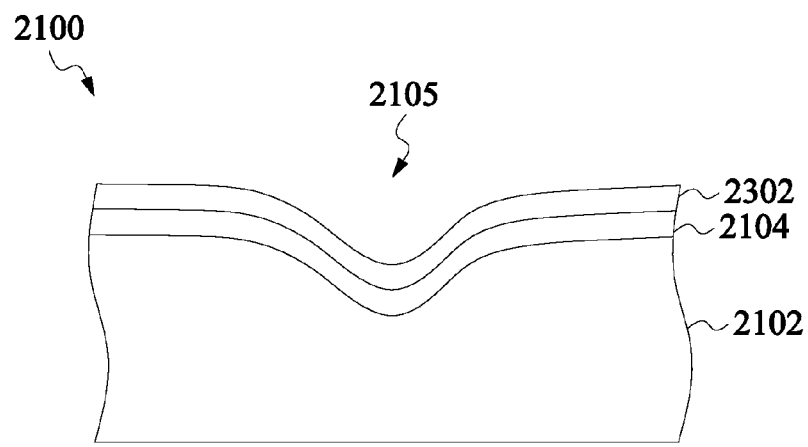

The method 2000 then proceeds to block 2004 where a carbon-containing layer is formed over the curved insulating layer 2104. Referring to the example of FIG. 23, and in an embodiment of block 2004, a carbon-containing layer 2302 is formed over the insulating layer 2104, thereby providing a carbon source for subsequent graphene layer formation. In some embodiments, prior to forming the carbon-containing layer 2302 over the insulating layer 2104, the surface of the insulating layer 2104 may be cleaned (e.g., to remove organic residues), for example, using a piranha solution and UPW rinse as described above.

In various embodiments, the composition and method of formation of the carbon-containing layer 2302 is substantially the same as the carbon-containing layer 402 discussed above with reference to the device 300 and the method 200. Thus, in some embodiments, the carbon-containing layer 2302 may likewise include a SAM or other suitable carbon-containing layer formed using one or more suitable precursors, as described above. In at least some embodiments, the carbon-containing layer 2302 includes a silane-based SAM, as described above. Additionally, the carbon-containing layer 2302 may also be formed by a VPD technique such as ALD and/or MLD, thereby effectively and conformally forming the carbon-containing layer 2302 on the insulating layer 2104 and along the concave region 2105. In various examples, any of the precursors and/or materials discussed above as useful for forming the carbon-containing layer 402 (e.g., by way of ALD and/or MLD) for the device 300 may likewise be used to form the carbon-containing layer 2302 for the device 2100 (or the device 2200).

Figure 24:
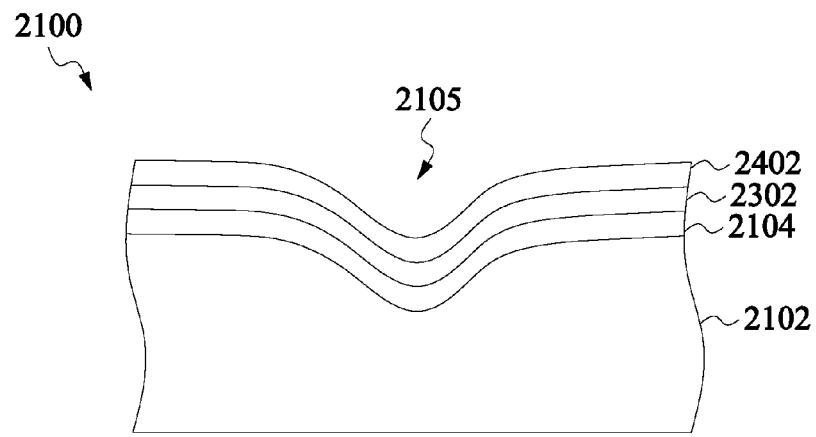

The method 2000 then proceeds to block 2006 where a metal layer is formed over the carbon-containing layer. Referring to the example of FIG. 24, and in an embodiment of block 2006, a metal layer 2402 is formed over the carbon-containing layer 2302 (e.g., the SAM). As described above, and in various embodiments, the metal layer 2402 may include Ni, Cu, Pt, Fe, Co, Au, a Cu—Ni alloy, or combinations thereof. In various embodiments, the metal layer 2402 may be formed using PVD, CVD, ALD, electron beam (e-beam) evaporation, and/or other suitable process.

Figure 25:
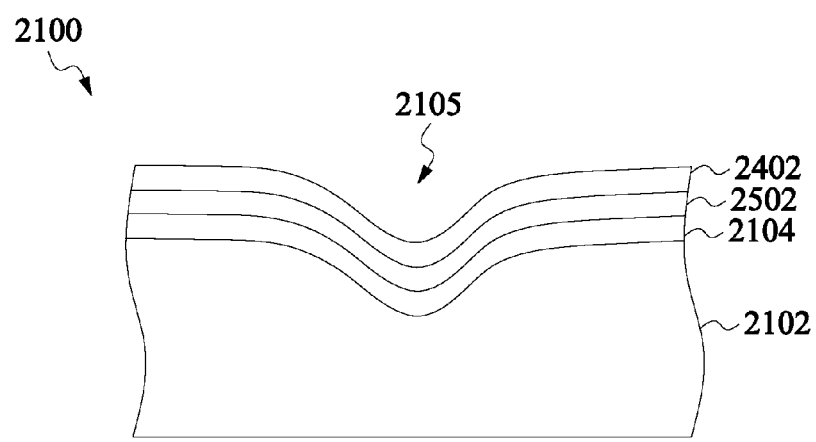

The method 2000 then proceeds to block 2008 where an anneal process is formed. Referring to the example of FIGS. 24 and 25, and in an embodiment of block 2008, the device 2100 may be annealed in order to convert the carbon-containing layer 2302 (FIG. 24) to a graphene layer 2502 (FIG. 25). In various embodiments, the conversion of the carbon-containing layer 2302 to the graphene layer 2502 is achieved by pyrolysis. As shown in FIG. 25, and as a result of the anneal process, the graphene layer 2502 is formed between the metal layer 2402 (e.g., the catalytic metal) and the insulating layer 2104. In various examples, the anneal process may be performed as described above with reference to block 208 of the method 200. In various embodiments, and depending in part on the thickness of the metal layer 2402, the composition of the carbon-containing layer 2302, and the annealing parameters (e.g., time, temperature, atmosphere, pressure, etc.), the graphene layer 2502 may include monolayer graphene, bilayer graphene, or multi-layer graphene (e.g., including more than two layers).

Figure 26:
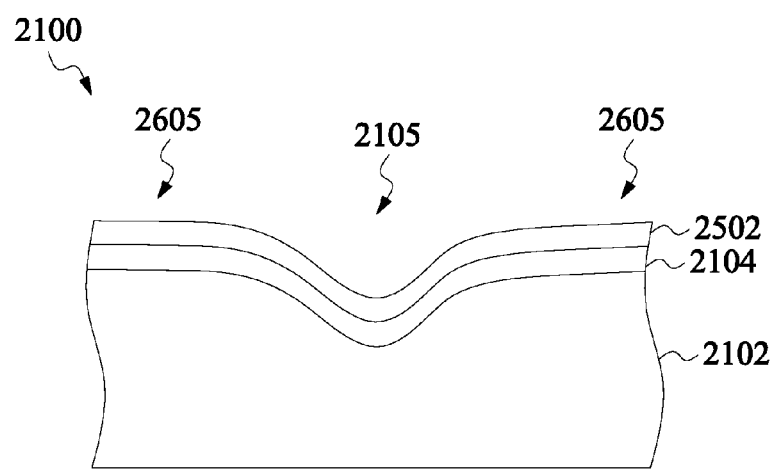

The method 2000 then proceeds to block 2010 where the metal layer is removed and a thermal treatment in a reducing atmosphere is performed. Referring to the example of FIGS. 25 and 26, and in an embodiment of block 2010, the metal layer 2402 may be removed. In various embodiments, and depending on the material used for the metal layer 2402 (e.g., Ni, Cu, Pt, Fe, Co, Au, a Cu—Ni alloy, or combinations thereof), the metal layer 2402 may be removed using an etching solution including, for example, ferric chloride ($FeCl_3$), hydrochloric acid (HCl), nitric acid ($HNO_3$), ammonium persulfate $(NH_4)_2S_2O_8$, or other metal etching solutions as known in the art. Thus, as shown in FIG. 26, the curved graphene layer 2502 has been directly formed on the insulating layer 2104 using a transfer-free process. Moreover, the graphene layer 2502 follows the surface contour of the underlying insulating layer/substrate. After removal of the metal layer 2402, and in a further embodiment of the block 2010, the now exposed curved graphene layer 2502 may be thermally treated in a reducing atmosphere. For example, in some embodiments, the device 2100 may be annealed at a temperature of about 800-1200 degrees Celsius in a $H_2/Ar$ atmosphere, in a $H_2/N_2$ atmosphere, in a $N_2H_2$ atmosphere, or in another appropriate reducing atmosphere.

Still referring to FIG. 26, illustrated therein is the curved (e.g., concave) region 2105 and regions 2605 adjacent to and on either side of the curved region 2105. In some embodiments, the regions 2605 are substantially planar and/or not intentionally processed to include curved regions, for example as described above with respect to formation of the curved region 2105. As such, the graphene layer 2502 (which conforms to the curvature of the underlying insulating layer 2104) is curved in the region 2105 and is substantially planar in the regions 2605. As a result of the curvature of the graphene layer 2502 within the region 2105, a band gap may be induced to open in the graphene layer 2502 within the curved region 2105, whereby the graphene layer 2502 may exhibit semiconducting behavior within the curved region 2105. In some embodiments, band gap may be induced to open in the graphene layer 2502 within the curved region 2105 when a non-zero electric field is applied to the graphene layer 2502. Additionally, in some embodiments, the graphene layer 2502 within the substantially planar regions 2605 may maintain a band gap substantially equal to zero, thereby exhibiting metallic behavior in the regions 2605. As used herein, the term "substantially planar" may be used to include planar graphene layers, as well as graphene layers having non-zero curvature, but where such non-zero curvature is insufficient to induce opening of a band gap within the graphene layer. In contrast, the curvature of the graphene layer (e.g., within the region 2105) is sufficient to induce opening of the band gap in the graphene layer, as described above, either by way of the curvature of the curved region 2105 alone, or in conjunction with an applied electric field. Thus, the device 2100 (or the device 2200) can be used to provide a graphene having a seamless transition between semiconducting graphene in the region 2105 (which will form a graphene device channel) and metallic graphene in regions 2605 (which will form graphene source/drain regions).

Figure 27:
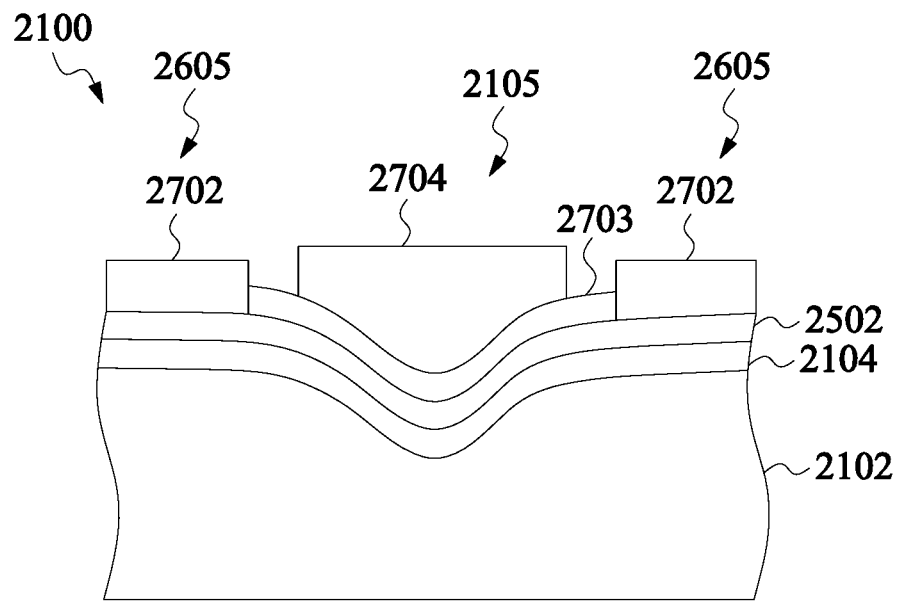
Figure 28:
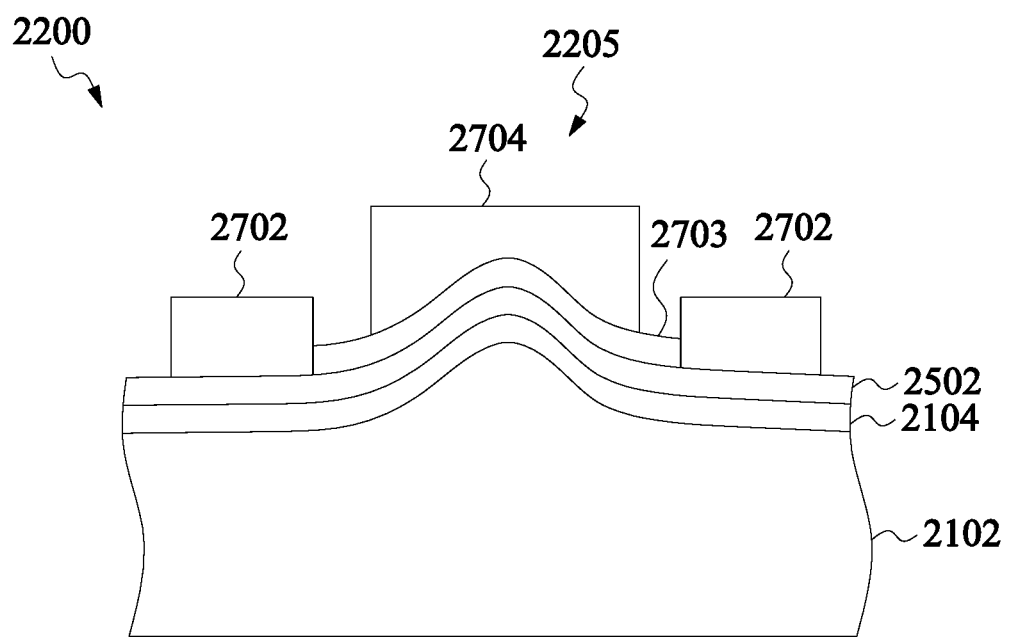

The method 2000 then proceeds to block 2012 where electrodes are formed. Referring to the example of FIG. 27, after performing the thermal treatment in the reducing atmosphere and in an embodiment of block 2012, source/drain electrodes 2702 and a gate electrode 2704 may be formed. The curved graphene transistor 2100 may be similar in some aspects to the device 300 as discussed above with reference to the method 200. For example, the graphene layer 2502 may be contacted in regions 2605 (metallic regions) by the source/drain electrodes 2702, a top-gate dielectric layer 2703 may be formed over the graphene layer 2502 in region 2105 (semiconducting region), and the top-gate electrode 27004 may be formed over the top-gate dielectric layer 2703. In various embodiments, the source/drain electrodes 2702, the top-gate dielectric layer 2703, and the top-gate electrode 2702 may include one or more materials, and be formed by one or more methods, as described above with reference to the device 300. In some embodiments, the substrate 2102 may also serve as a global back-gate separated from the graphene layer 2502 by the insulating layer 2104. In some embodiments, the device 2100 may include a top-gated curved graphene transistor, where the substrate includes an insulating substrate (e.g., for RF applications), such as described above with reference to FIG. 10. With reference to the example of FIG. 28, and in an additional embodiment of block 2012, electrodes may be formed on the device 2200 including the curved convex region 2205.

The device 2100 (or the device 2200) may undergo further processing to form various features and regions known in the art. For example, subsequent processing may form various contacts/vias/lines and multilayers interconnect features (e.g., metal layers and interlayer dielectrics) on the substrate 2102, configured to connect the various features to form a functional circuit that may include one or more graphene devices. In furtherance of the example, a multi-layer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. In some embodiments, the curved graphene devices 2100, 2200 may be formed over a substrate having a dielectric layer disposed thereon, where the substrate may include CMOS transistors (or other devices mentioned above) formed within the substrate, and where electrodes of the graphene devices 2100, 2200 (e.g., source/drain electrodes 2702) and electrodes of devices within the substrate may be connected through the dielectric layer by way of one or more contacts, vias, or other electrical interconnects. Moreover, additional process steps may be implemented before, during, and after the method 2000, and some process steps described above may be replaced or eliminated in accordance with various embodiments of the method 2000.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures for providing uniform, large-area graphene by way of a transfer-free, direct-growth process. In accordance with at least some embodiments of the present disclosure, a SAM is used as a carbon source for direct graphene synthesis on a substrate. Thus, embodiments disclosed herein provide one or methods to avoid the introduction of defects into graphene, and graphene devices, which could occur as a result of conventional graphene transfer processes, as described above. For example, in various embodiments, a carbon-containing SAM is formed on a substrate having an oxide layer (which may be curved), or on a CNT (or nanorod) with an oxide layer covering an outer CNT surface (or an outer nanorod surface), and a metal layer is formed over the SAM. The metal layer may serve as a catalytic metal, whereby the carbon-containing SAM is converted to graphene following an appropriate annealing process. In various embodiments, the SAM is deposited using a VPD process (e.g., an ALD process and/or an MLD process), providing a highly conformal SAM having excellent step coverage on high-aspect ratio structures, and facilitating SAM deposition onto any of a variety of surfaces and/or surface topographies. For example, embodiments disclosed herein provide for SAM deposition (and subsequent graphene conversion of the SAM by way of the catalytic metal and annealing process) not only on planar surfaces, but also on surfaces (e.g., oxide surfaces) around the circumference of a nanorod (e.g., an outer surface of the nanorod, for subsequent CNT formation), as well as on various other curved surfaces. In some embodiments, a CNT having a controlled size (e.g., diameter, height), shape, and/or band gap, may be formed on the surface of a nanorod by appropriately tuning the geometry of the nanorod. Additionally, in some embodiments, a curved graphene transistor may be formed over a curved oxide surface, thereby providing a band gap in a channel region of the graphene transistor. Thus, embodiments of the present disclosure provide for the formation of high-quality, large-area graphene over any type of surface topography and/or surface structure, avoiding the challenges associated with conventional graphene transfer techniques, while also providing for the fabrication of CNT/graphene structures and devices having desirably tuned properties.

Thus, one of the embodiments of the present disclosure described a method for fabricating a device (e.g., a graphene device), where the method includes providing a substrate including an insulating layer disposed thereon. In various embodiments, a carbon-containing layer is formed over the insulating layer by a vapor phase deposition process (e.g., ALD and/or MLD). Thereafter, a metal layer is deposited over the carbon-containing layer. By way of example, after depositing the metal layer, an annealing process is performed, where the annealing process serves to convert the carbon-containing layer into a graphene layer.

In another of the embodiments, discussed is a method where a substrate including a nanorod extending therefrom is provided. In various examples, the nanorod includes an insulating outer surface that traverses a circumference of the nanorod. In some embodiments, a carbon-containing layer is formed over the insulating outer surface by a vapor phase deposition process, and a metal layer is deposited over the carbon-containing layer. In various embodiments, after depositing the metal layer, an annealing process is performed, where the annealing process serves to convert the carbon-containing layer into a carbon nanotube (CNT).

In yet another of the embodiments, discussed is a device including a substrate having a first surface contour defined by a first region and a second region adjacent to and on either side of the first region. The first region includes a curved region and the second region includes a substantially planar region. In some embodiments, the device further includes an insulating layer formed over the first and second regions of the substrate, where the insulating layer includes a second surface contour that conforms to the first surface contour of the substrate. By way of example, the device also includes a graphene layer formed over the insulating layer, where the graphene layer includes a third surface contour that conforms to the second surface contour of the insulating layer. Further, the graphene layer over the first region includes a curved graphene layer, and the graphene layer over the second region includes a substantially planar graphene layer.

In some embodiments, the device may also include source and drain electrodes in contact with the graphene layer in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a substrate including an insulating layer disposed thereon;
   forming, by a vapor phase deposition process, a carbon-containing layer over the insulating layer, wherein the carbon-containing layer includes a self-assembled monolayer (SAM) including one of tridecafluoro-tetrahydrooctyl-trichlorosilane (FOTS) and dodecyl-trichlorosilane (DTS);
   depositing a metal layer over the carbon-containing layer; and
   after depositing the metal layer, performing an annealing process, wherein the annealing process serves to convert the carbon-containing layer into a graphene layer.

2. The method of claim 1, further comprising:
   after performing the annealing process, removing the metal layer and performing a thermal treatment of the graphene layer in a reducing atmosphere;
   after performing the thermal treatment, forming source and drain electrodes in contact with the graphene layer;
   after forming the source and drain electrodes, depositing a top-gate dielectric layer over the graphene layer; and
   forming a top-gate electrode on the top-gate dielectric.

3. The method of claim 2, wherein the thermal treatment is performed at a temperature of about 800-1200 degrees Celsius and in a reducing atmosphere including one of a $H_2/Ar$ atmosphere, a $H_2/N_2$ atmosphere, and a $N_2H_2$ atmosphere.

4. The method of claim 1, wherein the vapor phase deposition process includes at least one of an atomic layer deposition (ALD) process and a molecular layer deposition (MLD) process.

5. The method of claim 1, wherein the metal layer includes one of Ni, Cu, Pt, Fe, Co, Au, and a Cu—Ni alloy.

6. The method of claim 1, wherein the graphene layer includes one of monolayer graphene, bilayer graphene, and multi-layer graphene.

7. The method of claim 1, further comprising:
   providing the substrate including a first region and a second region adjacent to and on either side of the first region, wherein the first region includes a curved region and wherein the second region includes a substantially planar region;
   wherein the graphene layer in the first region includes a curved graphene layer, and wherein the graphene layer in the second region includes a substantially planar graphene layer.

8. The method of claim 7, wherein the graphene layer in the first region exhibits semiconducting behavior, and wherein the graphene layer in the second region exhibits metallic behavior.

9. The method of claim 7, further comprising:
after performing the annealing process, removing the metal layer and performing a thermal treatment in a reducing atmosphere; and
after performing the thermal treatment, forming source and drain electrodes in contact with the graphene layer in the second region;
after forming the source and drain electrodes, depositing a top-gate dielectric layer over the graphene layer in the first region; and
forming a top-gate electrode on the top-gate dielectric.

10. A method of fabricating a semiconductor device, comprising: providing an insulating substrate; forming, by a vapor phase deposition process, a carbon-containing layer over the insulating substrate, wherein the carbon-containing layer includes a self-assembled monolayer (SAM) including dodecyltrichlorosilane (DTS); depositing a catalytic metal layer over the SAM; and after depositing the catalytic metal layer, performing an annealing process, wherein the annealing process serves to convert the SAM into a graphene layer.

11. The method of claim 10, wherein the insulating substrate includes one of quartz, glass, ceramic, sapphire, and silicon carbide (SiC).

12. The method of claim 10, further comprising:
after performing the annealing process, removing the catalytic metal layer and performing a thermal treatment of the graphene layer in a reducing atmosphere;
after performing the thermal treatment, forming source and drain electrodes in contact with the graphene layer;
after forming the source and drain electrodes, depositing a top-gate dielectric layer over the graphene layer; and
forming a top-gate electrode on the top-gate dielectric.

13. The method of claim 12, wherein the thermal treatment is performed at a temperature of about 800-1200 degrees Celsius and in a reducing atmosphere including one of a $H_2/Ar$ atmosphere, a $H_2/N_2$ atmosphere, and a $N_2H_2$ atmosphere.

14. The method of claim 10, wherein the performing the annealing process includes performing the annealing process at a temperature from about 600-1200 degrees Celsius and for a duration of between about 1-60 minutes.

15. The method of claim 10, wherein the semiconductor device includes a radio-frequency (RF) graphene device.

16. The method of claim 10, further comprising:
providing the substrate including a first region and a second region adjacent to and on either side of the first region, wherein the first region includes a curved region and wherein the second region includes a substantially planar region;
wherein the graphene layer in the first region includes a curved graphene layer, and wherein the graphene layer in the second region includes a substantially planar graphene layer.

17. The method of claim 16, wherein the graphene layer in the first region exhibits semiconducting behavior, and wherein the graphene layer in the second region exhibits metallic behavior.

18. The method of claim 16, further comprising:
after performing the annealing process, removing the metal layer and performing a thermal treatment in a reducing atmosphere; and
after performing the thermal treatment, forming source and drain electrodes in contact with the graphene layer in the second region;
after forming the source and drain electrodes, depositing a top-gate dielectric layer over the graphene layer in the first region; and
forming a top-gate electrode on the top-gate dielectric.

19. A method, comprising:
providing a substrate including an insulating layer disposed thereon;
forming, by a molecular layer deposition (MLD) process, a self-assembled monolayer (SAM) over the insulating layer including tridecafluoro-tetrahydrooctyl-trichlorosilane (FOTS);
depositing a metal layer over the SAM, wherein the metal layer has a thickness of about 10-500 nanometers; and
after depositing the metal layer, performing a pyrolysis process, wherein the pyrolysis process is performed in an inert ambient at a temperature of about 600-1200 degrees Celsius for a duration of about 1-60 minutes, and wherein the pyrolysis process serves to convert the carbon-containing layer into a graphene layer.

20. The method of claim 19, further comprising:
after performing the pyrolysis process, removing the metal layer and performing a thermal treatment of the graphene layer in a reducing atmosphere, wherein the thermal treatment is performed at a temperature of about 800-1200 degrees Celsius and in a reducing atmosphere including one of a $H_2/Ar$ atmosphere, a $H_2/N_2$ atmosphere, and a $N_2H_2$ atmosphere;
after performing the thermal treatment, forming source and drain electrodes in contact with the graphene layer;
after forming the source and drain electrodes, forming a nucleation layer over the graphene layer and depositing a top-gate dielectric layer over the nucleation layer; and
forming a top-gate electrode on the top-gate dielectric.

* * * * *